(12) United States Patent
Sluss et al.

(10) Patent No.: US 7,069,522 B1
(45) Date of Patent: Jun. 27, 2006

(54) VARIOUS METHODS AND APPARATUSES TO PRESERVE A LOGIC STATE FOR A VOLATILE LATCH CIRCUIT

(75) Inventors: Gene T. Sluss, Pleasanton, CA (US); Deepak D. Sherlekar, Cupertino, CA (US); Tushar R. Gheewala, Los Altos, CA (US)

(73) Assignee: Virage Logic Corporation, Fremont, CA (US)

( * ) Notice: Subject to any disclaimer, the term of this patent is extended or adjusted under 35 U.S.C. 154(b) by 0 days.

(21) Appl. No.: 10/856,520

(22) Filed: May 28, 2004

Related U.S. Application Data

(60) Provisional application No. 60/475,248, filed on Jun. 2, 2003.

(51) Int. Cl.
*G06F 17/50* (2006.01)

(52) U.S. Cl. .............................. 716/1; 716/10; 716/11; 716/12

(58) Field of Classification Search .................... 716/1, 716/6, 11–14, 10
See application file for complete search history.

(56) References Cited

U.S. PATENT DOCUMENTS

| | | | |
|---|---|---|---|
| 5,468,977 A | 11/1995 | Machida | |
| 5,723,883 A | 3/1998 | Gheewalla | |
| 5,740,102 A * | 4/1998 | Kawashima | ................. 365/154 |
| 5,742,542 A | 4/1998 | Lin et al. | |
| 5,898,194 A | 4/1999 | Gheewala | |
| 5,917,228 A | 6/1999 | Matsuda et al. | |
| 5,923,059 A | 7/1999 | Gheewala | |
| 5,923,060 A | 7/1999 | Gheewala | |
| 5,981,987 A | 11/1999 | Brunolli et al. | |
| 6,091,090 A | 7/2000 | Gheewala | |
| 6,184,726 B1 * | 2/2001 | Haeberli et al. | ............... 327/96 |
| 6,249,471 B1 | 6/2001 | Roy | |
| 6,307,272 B1 | 10/2001 | Takahashi et al. | |
| 6,445,065 B1 | 9/2002 | Gheewala et al. | |
| 6,448,631 B1 | 9/2002 | Gandhi et al. | |
| 6,617,621 B1 | 9/2003 | Gheewala et al. | |
| 6,938,225 B1 * | 8/2005 | Kundu | ........................... 716/1 |
| 6,941,258 B1 * | 9/2005 | Van Heijningen et al. | ...... 716/6 |

OTHER PUBLICATIONS

Victor V. Zyuban et al., "Low Power Integrated Scan-Retention Mechanism", (IBM), ISPLED 2002, Aug. 12-14, 2002, pp. 1-18.
Virage Logic, "Speed Power, ASAP Standard Cell Libraries", Copyright 2002 Virage Logic Corporation, pp. 4 total.

* cited by examiner

*Primary Examiner*—Paul Dinh
(74) *Attorney, Agent, or Firm*—Blakely, Sokoloff, Taylor & Zafman, LLP

(57) ABSTRACT

Various methods and apparatuses are described in which a volatile latch circuit. The volatile latch circuit may have a master latch sub circuit coupled to a slave latch sub circuit. The slave latch sub circuit maintains the logic state stored by the volatile latch circuit. The slave sub circuit may connect to a first power trace that continuously provides a first voltage potential to the slave latch sub circuit even during a sleep mode. The master latch sub circuit may connect to a second power trace that provides a second voltage potential to the master latch sub circuit that is switchably turned off during the sleep mode.

27 Claims, 6 Drawing Sheets

VARIOUS METHODS AND APPARATUSES TO PRESERVE A LOGIC STATE FOR A VOLATILE LATCH CIRCUIT

RELATED APPLICATIONS

This application claims the benefit of and priority to provisional application No. 60/475,248 that was filed on Jun. 2, 2003 and is entitled, "LOW POWER MEMORY DESIGN."

NOTICE OF COPYRIGHT

A portion of the disclosure of this patent document contains material that is subject to copyright protection. The copyright owner has no objection to the facsimile reproduction by anyone of the software engine and its modules, as it appears in the Patent and Trademark Office Patent file or records, but otherwise reserves all copyright rights whatsoever.

FIELD OF THE INVENTION

Embodiments of the invention generally relate to integrated circuits using a power trace routing scheme. More particularly, an aspect of an embodiment of the invention relates to integrated circuits using the power trace routing scheme with state elements to store logic values and achieve a reduction of power.

BACKGROUND OF THE INVENTION

CMOS logic circuits consume static power when the circuit is inactive. In one prior technique, a static power reduction techniques allows unused portions of a circuit to be turned off when the circuit is inactive to save power. However, disconnecting the circuit from the supply also results in a loss of the logic state that is preserved in latches/flip-flop storage elements.

Another prior technique uses volatile latch circuits cooperating with non-volatile latch circuits to store the logic state of the volatile latch circuit. These shadow non-volatile latches require additional circuitry and add dynamic power during normal operation.

In CMOS standard cell based and gate-array integrated circuits, providing multiple supplies of different voltage potential may be needed for biasing the substrate and/or Nwell potential separately from the device source potential(s). A possible solution is by routing multiple supplies carrying distinctly different voltage potentials within each cell boundary on the first metal routing layer (M1). However, this solution consumes lots of area on a chip since 1) the power supply wiring, 2) the cell connection and 3) the signaling wiring all use the same routing layer. Further, the routing of power supply lines entirely in the first metal layer causes cell wiring to be excluded from the regions of the cell where those power supply wiring are routed. The cell wiring is excluded from the regions of the cell regardless of whether or not that voltage supply wiring is used by the specific cell because the power traces on the M1 layer extend into the macro cell and occupy area that would have been available for cell and signaling routing.

SUMMARY OF THE INVENTION

Various methods and apparatuses are described involving a volatile latch circuit. The volatile latch circuit may have a master latch sub circuit coupled to a slave latch sub circuit. The slave latch sub circuit maintains the logic state stored by the volatile latch circuit. The slave sub circuit may connect to a first power trace that continuously provides a first voltage potential to the slave latch sub circuit even during a sleep mode. The master latch sub circuit may connect to a second power trace that provides a second voltage potential to the master latch sub circuit that is switchably turned off during the sleep mode.

BRIEF DESCRIPTION OF THE DRAWINGS

The drawings refer to embodiments of the invention in which.

Figure 1:
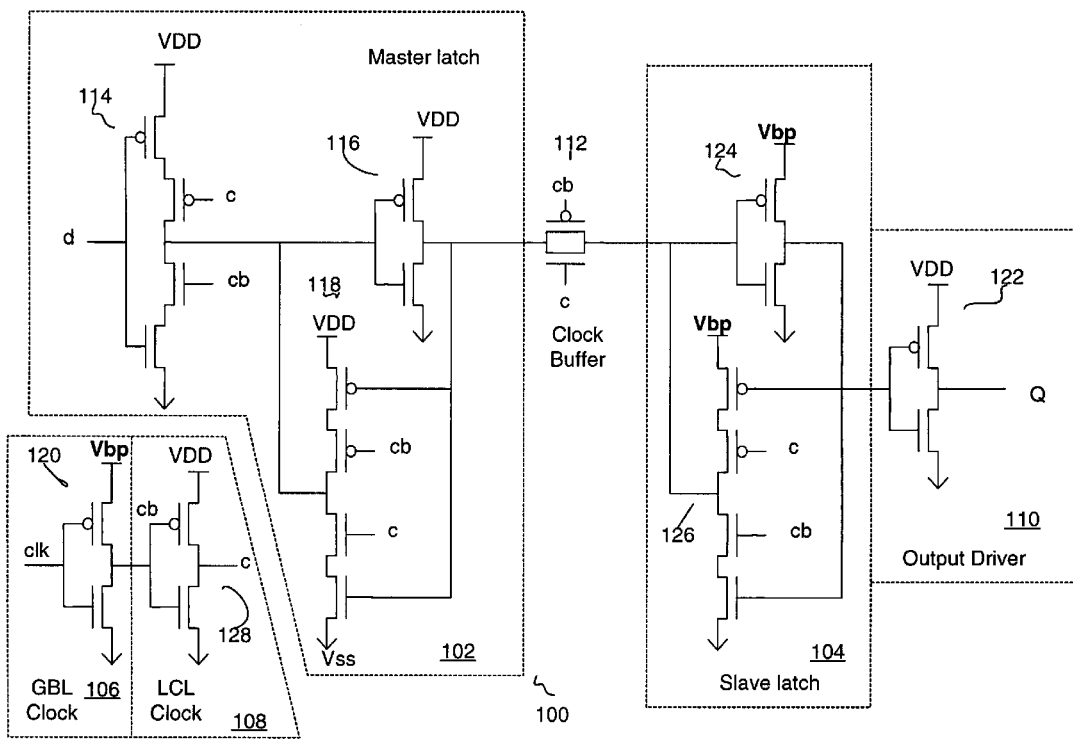
FIG. 1 illustrates a block diagram of an embodiment of a volatile latch circuit having a master latch sub circuit and a slave latch sub circuit to store and maintain a logic value.

While the invention is subject to various modifications and alternative forms, specific embodiments thereof have been shown by way of example in the drawings and will herein be described in detail. The invention should be understood to not be limited to the particular forms disclosed, but on the contrary, the intention is to cover all modifications, equivalents, and alternatives falling within the spirit and scope of the invention.

DETAILED DISCUSSION

In the following description, numerous specific details are set forth, such as examples of specific data signals, named components, connections, type of transistors, etc., in order to provide a thorough understanding of the present invention. It will be apparent, however, to one of ordinary skill in the art that the present invention may be practiced without these specific details. In other instances, well known components or methods have not been described in detail but rather in a block diagram in order to avoid unnecessarily obscuring the present invention. Further specific numeric references such as first transistor, may be made. However, the specific numeric reference should not be interpreted as a literal sequential order but rather interpreted that the first transistor is different than a second transistor. Further, an example D flip flop latch circuit configuration will be illustrated. However, the specific details and implementations set forth are merely exemplary. The specific details and implementations may be varied from and still be contemplated to be within the spirit and scope of the present invention.

In general, various methods and apparatuses are described in which an integrated circuit, such as an Application Specific Integrated Circuit (ASIC), Digital Signal Processor (DSP), Intellectual Property Core on a System On a Chip (core on a SOC), or other similar circuit that contains multiple volatile latch circuits. One or more of the volatile latch circuits may have a master latch sub circuit and a slave latch sub circuit to store and maintain a logic value. The volatile latch circuit may be configured to operate in two or more modes of operation including a normal active mode and a sleep mode. The volatile latch circuit has a plurality of transistors contained in a single macro cell. A first power trace supplies a VDD voltage potential. A second power trace supplies a VSS voltage potential. A third power trace supplies a third voltage potential, which is separate from the VDD and VSS voltage potentials. Similarly, a fourth power trace supplies a fourth voltage potential, which is separate from the VDD and VSS voltage potentials. For example, the voltage potential of the VDD may be +5 volts and the third potential may also be +5 volts, however, the voltage potentials are being carried on two different power traces and coming from two different voltage sources.

All of the power traces connect to the volatile latch circuit. The first power trace connects to source terminals of a first set of one or more transistors in the macro cell. The third power trace connects to source terminals of a second set of one or more transistors in the macro cell in order to preserve the logic state of the volatile latch during the sleep mode.

FIG. 1 illustrates a block diagram of an embodiment of a volatile latch circuit having a master latch sub circuit and a slave latch sub circuit to store and maintain a logic value. The volatile latch circuit 100 may be scan flip-flops, non-scan flip flops, as well as other types of circuits that latch onto data as long as some power is applied to that circuit. The volatile latch circuit 100 may include multiple sub circuits each having combinations of one or more transistors and each sub circuit providing a different function. For example, the volatile latch circuit 100 may have a master latch sub circuit 102, a slave latch sub circuit 104, a global clock sub circuit 106, a local clock sub circuit 108, an output driver 110, and a clocked buffer sub circuit 112. The macro cell (aka sequential logic cell) implementing the circuit contains all of the sub circuits.

The master latch sub circuit 102 has three sets of transistors, 114–118. The source terminal of the lead PMOS transistor in each set of transistors 114–118 connects to a VDD voltage potential. The source terminal of the bottom NMOS transistor in each set of transistors 114–118 connects to a VSS (Ground) voltage potential. The master latch sub circuit 102 acts as an input to receive new data to be stored in this volatile latch circuit 100.

The local clock sub circuit 108 has one set of transistors 128. The source terminal of the lead PMOS transistor connects to the VDD voltage potential. The source terminal of the bottom NMOS transistor connects to the VSS voltage potential. The local clock sub circuit 108 buffers and conditions the signal from the global clock sub circuit 106. The local clock sub circuit 108 also distributes the conditioned clocked timing signal through this particular volatile latch circuit 100. The local clock sub circuit 108 may condition the leading and lagging edges of the clock signal and/or alter the interval of the clock signal within this volatile latch circuit 100. The local clock sub circuit 108 supplies an enable signal to the clocked buffer sub circuit 112 to determine whether the slave latch sub circuit 104 is isolated from the rest of the volatile latch circuit 100 or not.

The Output Driver 110 has one set of transistors 122. The source terminal of the lead PMOS transistor connects to the VDD voltage potential. The source terminal of the bottom NMOS transistor connects to the VSS voltage potential. The Output Driver 110 connects to a system bus to communicate the value of the logic state stored in the slave latch sub circuit 104 to the rest of the integrated circuit.

The VDD voltage potential powers all three of the above sub circuits, 102, 108, 110. A first power trace provides the VDD voltage potential to the transistors in each of the above sub circuits 102, 108, 110. The VDD voltage potential is switchably turned off during a sleep/standby mode. Thus, the majority of the entire integrated circuit along with portions of the volatile latch circuit itself may be switched off in the sleep/standby mode by turning off the main VDD voltage supply.

The slave latch sub circuit 104 has two sets of transistors 124, 126. The source terminal of the lead PMOS transistor in each set of transistors connects to a third voltage potential, such as Vbp. The source terminal of the bottom NMOS transistor in each set of transistors connects to a VSS voltage potential. As discussed, the master latch sub circuit 102 acts as an input to receive new data to be stored in this volatile latch circuit 100. The slave latch sub circuit 104 then maintains the logic state stored by the volatile latch circuit 100. The slave latch sub circuit 104 connects to a power trace that continuously provides a third voltage potential, Vbp, to the slave latch sub circuit 104 even during the sleep/standby mode. Thus, the volatile slave latch sub circuit 104 maintains the logic state stored by the volatile latch circuit 100 even during the sleep/standby mode. The macro cell contains a positive master latch cooperating with a negative slave latch.

The global clock sub circuit 106 has one set of transistors 120. The source terminal of the lead PMOS transistor connects to the Vbp voltage potential. The source terminal of the bottom NMOS transistor connects to the VSS voltage potential. The global clock sub circuit 106 remains active to receive the various modes of operation signals and activate the sub circuits in the latch accordingly.

A third power trace provides the VSS potential to all of the sub circuits in the volatile latch circuit 100.

The power traces may be routed horizontal with respect to the cell layout containing the volatile latch circuit. Thus, the power traces may be routed in the same direction as the rows of macro cells laid out on the chip. The four or more power traces may connect to the macro cell containing the volatile latch circuit. The four or more power traces may each carry a different voltage potential to the volatile latch circuit.

The integrated circuit may use many of these volatile latch circuits to store and maintain numerous logic values in the integrated circuit. Each of the volatile latch circuits 100 contains a master latch sub circuit 102 and a slave latch sub circuit 104.

In operation, the master latch sub circuit 102 receives and temporally stores new data until that new data is transferred into the master latch sub circuit 102. On the next clock cycle of that volatile latch circuit 100, the master latch sub circuit 102 transfers the logic value it is storing, i.e. the new data, into the slave latch sub circuit 104 to store and maintain that logic value. The state of the element is preserved in the slave latch sub circuit 104.

Two things occur to preserve the logic state of this volatile latch circuit 100. The source terminals of the transistors in the slave latch sub circuit 104 are biased separately from the main source potential, VDD. The local clock sub circuit 108 of this latch circuit turns on and off a clocked buffer circuit 112 to isolate the slave latch sub circuit 104 from the rest of the volatile latch circuit 100 as well as connect the slave latch sub circuit 104 with the rest of the volatile latch circuit 100, when appropriate. The source terminal connections of the transistors in the slave latch sub circuit 104 connect to a voltage supply that remains active when neighboring devices and other portions of the latch circuit are powered down. The storage element in the slave latch sub circuit 104 is isolated so that undesirable currents do not flow when neighboring devices and sub circuits are powered down. The transmission gate of the slave latch sub circuit 104 may be driven to a state that guarantees there is high impedance path at the input of the slave latch sub circuit 104. The clock signal may be conditioned to a known state that insures the transmission gate is at that high impedance. Thus, the global clock circuit 106 may be connected to the always on voltage supply, Vbp, to be conditioned to a known state and to control the impedance provided by the clocked buffer 112. Overall, the volatile latch circuit 100 may preserve its machine state during reduced power consumption modes such as a standby/sleep mode.

The VDD potential can be modulated on and off with another device on chip or the supply can be provided from off chip. Similarly, the substrate/Pwell of the NMOS transistors are connected to the Vbn voltage potential and the Vbn supplies the source terminals of the NMOS transistors. This allows the voltage VSS and VBN to be independently modulated to reduce static power during standby or non-operation of the circuit.

The sets of transistors in the slave latch sub circuit 104 and global clock circuit 106 may have the PMOS source and Nwell connections at the same voltage potential, Vbp. The sets of transistors in the other sub circuits may have PMOS transistors with connections to the Nwell at a VBP voltage potential and the source terminals are at the VDD voltage potential.

The additional voltage potential supplies connecting to the circuits may switch roles with the source voltages VDD and VSS. For example, the VDD potential may be the potential that is always on. The additional voltage potential supplies that connect to the latch circuit may provide more functions then simply turning on and off components. The voltage differential between the terminal of a transistor and the well of a transistor may be varied to effect performance of that transistor. For example, the VDD voltage potential can be changed to a lower potential to reduce current leakage in components (sub threshold leakage as well as gate leakage) and thereby reduce static power consumption.

Figure 2:
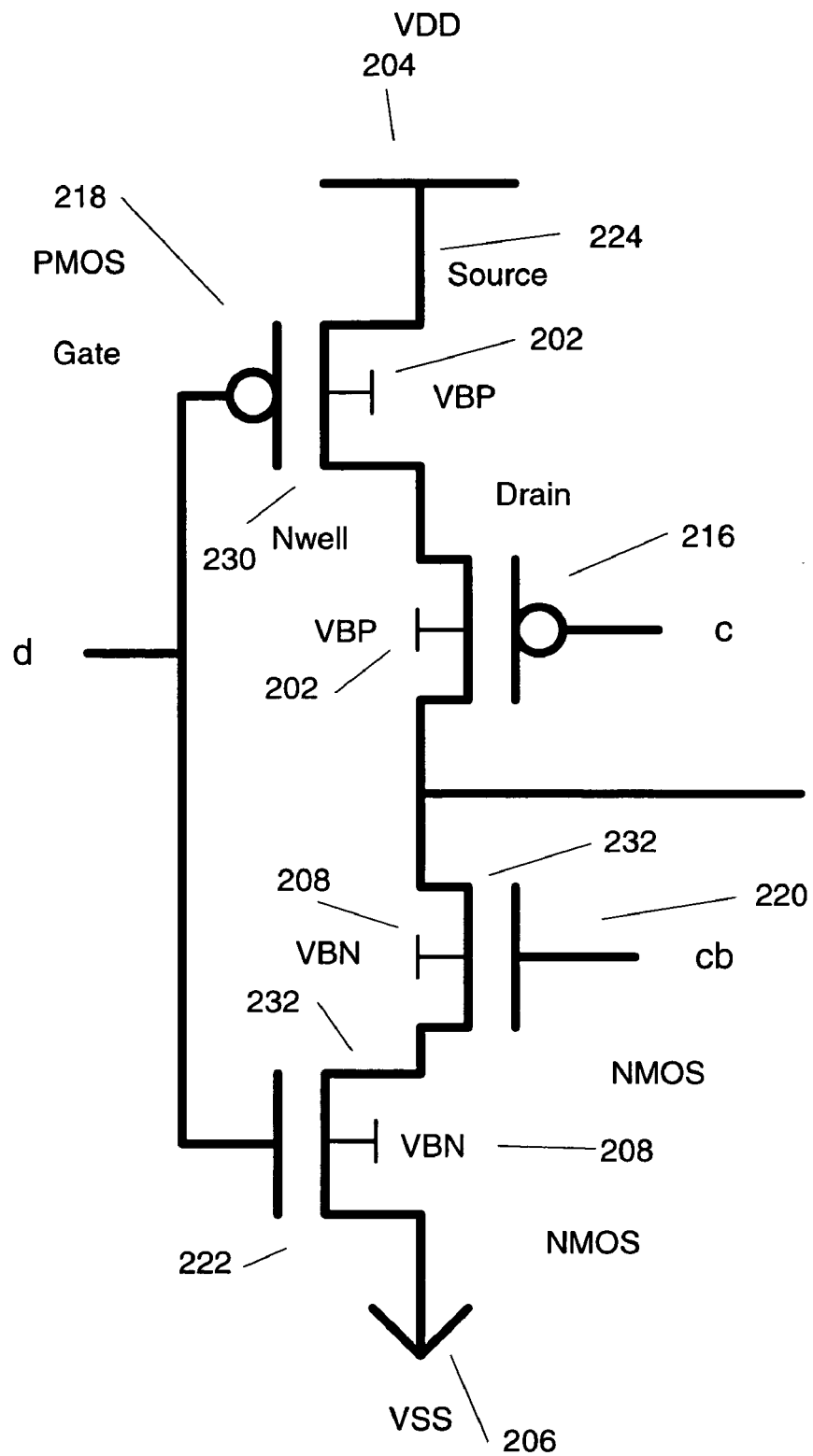
FIG. 2 illustrates a schematic diagram of an embodiment of a sub circuit having three or more voltage potentials supplied to that circuit to allow an embodiment of the volatile latch circuit to operate in three or more performance modes.

FIG. 2 illustrates a schematic diagram of an embodiment of a sub circuit having three or more voltage potentials supplied to that circuit to allow an embodiment of the volatile latch circuit to operate in three or more power modes as well as three or more performance modes. The source terminal 224 of the first PMOS transistor connects to a first power trace 204 supplying a VDD voltage potential. A second power trace 202 supplies a third voltage potential, Vbp, to an Nwell substrate 230 of the first PMOS transistor 218. A third power trace 206 supplies a VSS voltage potential to a source terminal 228 of a second NMOS transistor 222. A fourth power trace 208 supplies a fourth voltage potential to a Pwell substrate 232 of one or more of the NMOS transistors 220, 222. The additional voltage potential supplies connecting to the transistors allow the volatile latch circuit to operate in three or more power modes as well as three or more performance modes.

The voltage potentials on the four power traces 202–208 may be turned on and off to allow the latch circuit to operate in different modes of operation such as a normal mode, a sleep mode, and a shutdown mode. In sleep mode, the majority of the integrated circuit has been powered down; however, a portion in the latch circuits remains powered to store the logic state stored by that latch.

Both the first power trace 204 and the second power trace 202 are routed along a horizontal row of macro cells containing the macro cell implementing the master latch sub circuit 102 and the slave latch sub circuit 104. The portion of the macro cell implementing the master latch sub circuit 102 connects to both the first power trace 204 and the second power trace 202. The portion of the macro cell implementing the slave latch sub circuit 104 connects merely to the second power trace 202 204 but not the first power trace 204. Therefore, controlling whether power is applied to the first power trace by removing the voltage potential from the first power trace 204 allows for different modes of power operation within this macro cell.

The voltage potentials on the four power traces 202–208 may also be changed from a first voltage level, such as +5 volts, to a second voltage level, such as +3 volts. The changing of the voltage potential carried on a power trace allows the volatile latch circuit to operate in additional power modes that minimize leakage current as well as add different performance modes that increase or decrease the switching time associated with this volatile latch circuit.

Accordingly, the second power trace 202 supplies a third voltage potential, Vbp, to an Nwell substrate 230 of one or more of the PMOS transistors 216, 218 to bias the well of that MOS FET transistor. The third voltage potential may bias the Nwell substrate 230 higher than the source voltage, VDD, on the first power trace 204 to reduce power loss due to leakage. The fourth voltage potential may bias the Pwell 232 substrate lower than the source voltage, VSS, on the third power trace 206 to reduce power loss due to leakage. The third voltage potential may bias the Nwell substrate 230 closer to the voltage potential of the source voltage on the first power trace 204 to reduce threshold voltage of that transistor and increase performance time of that transistor. Therefore, controlling the voltage differential between the terminal of a transistor and the well of a transistor allows for different modes of performance within this macro cell.

Figure 3:
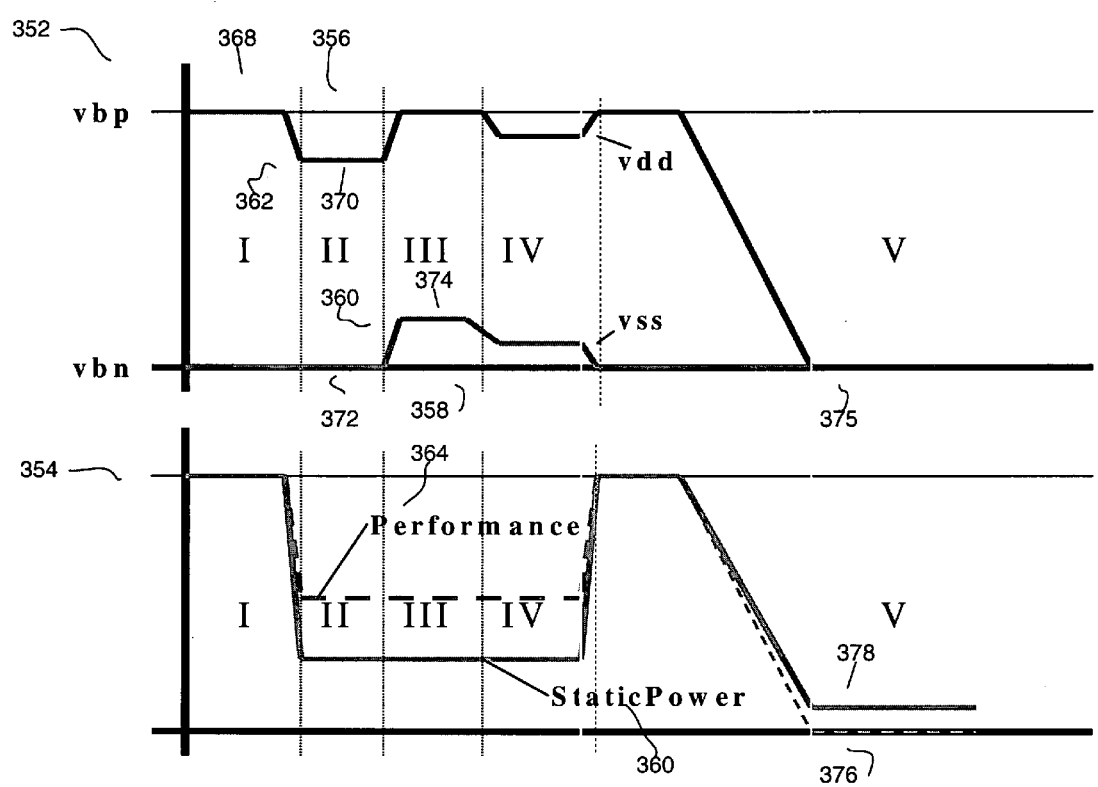
FIG. 3 illustrates a graph of an embodiment of a volatile latch circuit being biased to operate in three or more power modes as well as three or more performance modes.

FIG. 3 illustrates a graph of an embodiment of a volatile latch circuit being biased to operate in three or more power modes as well as three or more performance modes. The top graph 352 illustrates the voltage level relationships of the transistor well biasing potentials, Vbp 356 and Vbn 358, with respect to the corresponding source voltage, VDD 362, VSS 360, sensed on the source terminal of that transistor. The bottom graph 354 illustrates the expected overall performance 366 and power consumption 368 of the volatile latch circuit when biased in accordance with the relationships illustrated in the top graph 352.

At time one (I), normal operations are occurring. The Vdd voltage potential 362 sensed on the source terminals on the sets of transistors in the volatile latch circuit has a fixed relationship to the third voltage potential 356, Vbp, biasing the Nwells of those transistors. Also, the Vss voltage potential 360 sensed on the source terminals on the sets of transistors in the volatile latch circuit has a fixed relationship to the fourth voltage potential 358, Vbn, biasing the Pwells of those transistors. The volatile latch circuit operates in a maximum performance mode 364 as well as a maximum power consumption mode 366.

At time two (II), power savings operations are occurring. The Vdd voltage potential 362 sensed on the source terminal of the set of transistors decreases in relationship to the third voltage potential 356, Vbp, biasing the Nwells of those transistors. Thus, the Vdd voltage potential 362 on the first power trace changes from a first voltage level 368 to a second voltage level 370. The Vss voltage potential 360 sensed on the source of the sets of transistors maintains a fixed relationship to the fourth voltage potential 358, Vbn, biasing the Pwells of those transistors. The volatile latch circuit operates in a mid level performance mode as well as a mid level power consumption mode. The decrease of the Vdd voltage potential 362 increases the threshold voltage of those transistors and increases the actual time to switch states; thereby, decreasing the switching performance time. However, the increased threshold voltage of those transistors reduces leakage current. Thus, when the latch circuit is not being required to store new data, then the static power consumed by that latch circuit is reduced due to a reduction in the leakage current. Note, the third voltage potential 356, Vbp, on the second power trace could also change from a first voltage level to a second voltage level while the VDD voltage potential 362 maintained its voltage level to cause the same effect.

At time three (III), power savings operations are also occurring. The Vdd voltage potential 362 sensed on the source terminal maintains its fixed relationship to the third voltage potential 356, Vbp, biasing the Nwells of those transistors. However, the Vss voltage potential 360 sensed on the source terminal on that set of transistors increases the difference in potential between the VSS voltage potential 360 and the fourth voltage potential 358, Vbn, biasing the Pwells. Thus, the Vss voltage potential 360 on the third power traces changes from a first voltage level 372 to a second voltage level 374. The volatile latch circuit once again operates in a mid level performance mode as well as a mid level power consumption mode. Note, the fourth voltage potential 358, Vbn, on the fourth power trace could also change from a first voltage level to a second voltage level to cause the same effect.

At time four (IV), power savings operations also are occurring. The Vdd voltage potential 362 sensed on the source on sets of PMOS transistors decreases in relationship to the third voltage potential 356, Vbp, biasing the Nwells of those transistors. Thus, the Vdd voltage potential 362 on the first power traces changes from a first voltage level to a second voltage level. However, the magnitude of change in voltage level was not as great as the change was in time two (II). Also, the Vss voltage potential 360 sensed on the source on sets of NMOS transistors slightly increases the difference in potential between VSS voltage potential 360 and the fourth voltage potential 358, Vbn, biasing the Pwells. The volatile latch circuit once again operates in a mid level performance mode as well as a mid level power consumption mode.

At time five (V), a shift from normal operations to sleep/standby mode occurs. At the beginning of time five, the Vdd voltage potential 362 has a fixed relationship to the third voltage potential 356. During the sleep mode, the, for example, Vdd voltage potential 362, is turned off, and thus, transitions to a second voltage potential equal to zero 375. The performance level of the volatile latch circuit transitions to minimum/none 376. The power consumption transitions to a minimum level 378. The power consumption is above a zero level because the certain slave latch sub circuits remain powered by Vbp to maintain the logic state of that latch circuit.

In the top graph 352, the VSS voltage potential 360 and the third voltage potential 358 may be the same voltage potential. However this is not a requirement for the circuit operation. In fact, additional benefit can be achieved by separately biasing the VSS voltage potential 360 and the third voltage potential 358. For instance, if VBN, which is tied to the substrate, is held at ground potential (0V) and a positive bias is applied to VSS then the NMOS threshold voltage will increase in addition to decreasing the drain to source voltage (VDD/VBP−VSS) across the devices. This will decrease the amount of device leakage (sub threshold and also gate leakage) resulting in lower static power. In addition dynamic power can also be reduced.

Thus, the multiple voltages supplied to a volatile latch circuit design allows preservation of a logic state for storage elements used in low power capable integrated circuits. The multiple voltages supplied to a volatile latch circuit uses minimal or no addition of active devices to most latch circuits. Merely, the circuit uses routing of additional voltage supplies to each volatile latch circuit on the System On a Chip. Thus, the volatile latch circuit with multiple voltage supplies may allow the preservation of machine state without the addition of active circuit devices and also allows for tuning circuit performance and power.

Further, the volatile latch circuit with multiple voltage supplies may not need the use of specially constructed multi-threshold devices. Also, there may be no increase in dynamic power in normal active state. Further, there may be no appreciable increase in cell area over that which could be constructed without this feature.

The volatile latch circuit with multiple voltage supplies may provide the opportunity to reduce static power consumption by allowing the modulation of the VDD or VSS supply independent of the well voltage potential(s). Further, the state of the element can be preserved even when VDD (VSS) is disconnected from the circuit.

This circuit can be included in combination with other circuits (with source supplies connected to a VDD/VSS) to enable a low power logic platform that provides preservation of logic state and significant reduction in static power with no area increase.

In an embodiment, the four or more power traces may all be routed parallel to a row of macro cell containing these sub circuits.

Figure 4A:
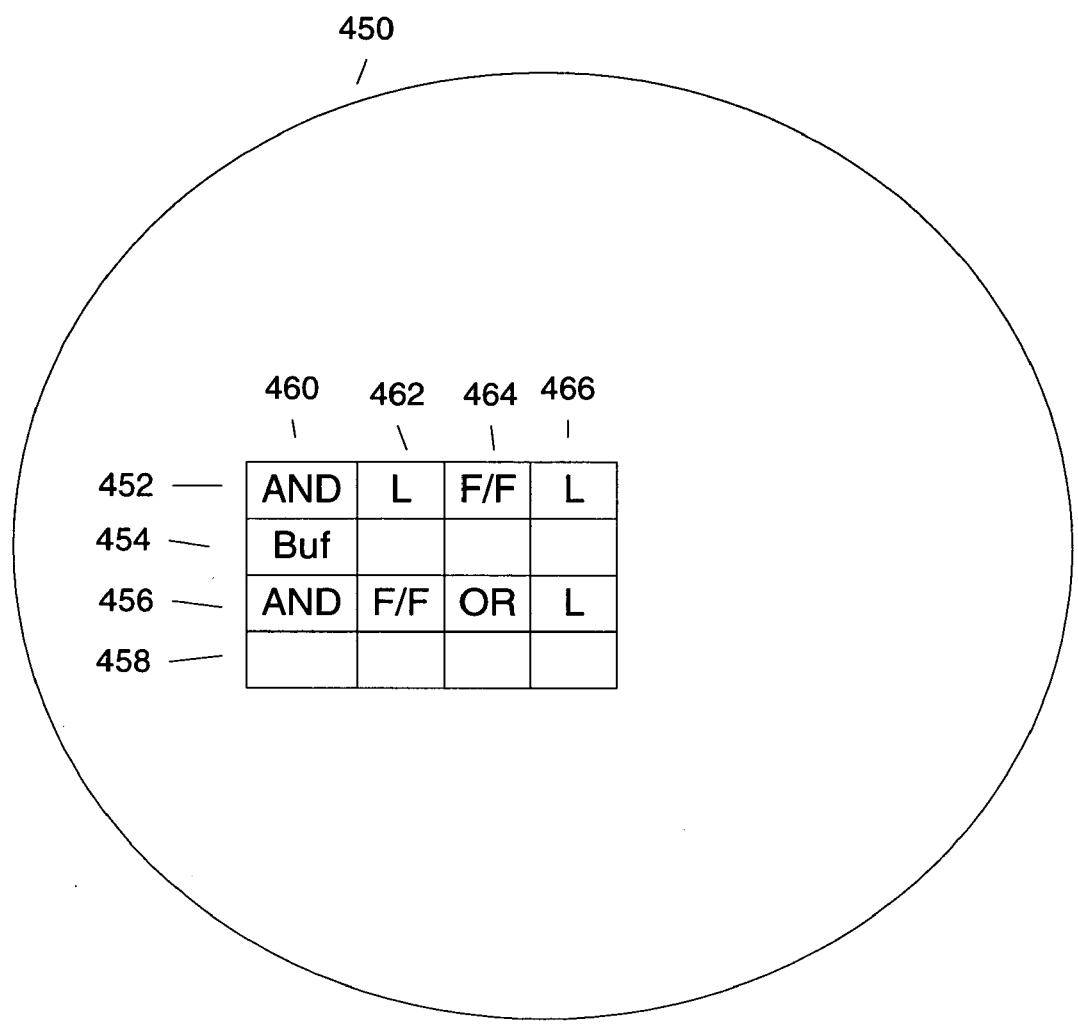
FIG. 4a illustrates a block diagram of an embodiment of an integrated circuit organized in rows and columns of macro cells.

FIG. 4a illustrates a block diagram of an embodiment of an integrated circuit organized in rows and columns of macro cells. The chip 450 may be organized into horizontal rows of macro cells, 452–458. For example, the first row of macro cells 452 may contain a first macro cell 460 implementing a NAND gate, a second macro cell 462 implementing a sub latch circuit, a third macro cell 464 implementing a flip flop circuit such as the clock sub circuit, a fourth macro cell 466 implementing a sub latch circuit, etc. The multiple power traces carrying different voltage potentials described above may be routed over and along the horizontal rows of macro cells 452–458. The first macro cell 460 may connect to all four power traces. The second macro cell adjacent 462 to the first macro cell 460 and in the same set of rows as the first macro cell 460 may connect to the second, third, and fourth power trace but not the first power trace.

A macro cell may be formed by a conglomeration of interconnected adjacent basic cells to implement a specific function. Thus, a given macro cell may be formed to implement the entire above described latch circuit or portions of the above described latch circuit such as the master latch sub circuit. Basic cells may be the basic atomic unit in circuit creation and may contain a fixed set of components such as transistors. The basic cell may be tiled across a region of the chip. Macro cells implementing different functions/circuits may belong to a cell library. A complete block of Intellectual Property on a chip may be formed by interconnecting instances of macro cells.

Macro cells may be used in standard cell design as well as in gate array design. In standard cell design, the transistors in a basic cell may be customized in cell height size, location, and interconnections in order to implement a given function/circuit as efficiently as possible. The transistor size and arrangement may be unique from one basic cell to another.

In gate array cell design, the transistors in a basic cell may be a fixed pattern. A sequence of interconnecting adjacent basic cells in a row forms a metal programmable macro cell that implements a given function/circuit. Thus, the macro cell circuit implementation is constrained by the fixed set of transistors available in the one or more adjacent basic cells forming the macro cell. A circuit design tool, such as a complier, may utilize standard cell and gate array designs to create circuits formed by macro cells that connect to one or more of the power supply traces.

Figure 4B:
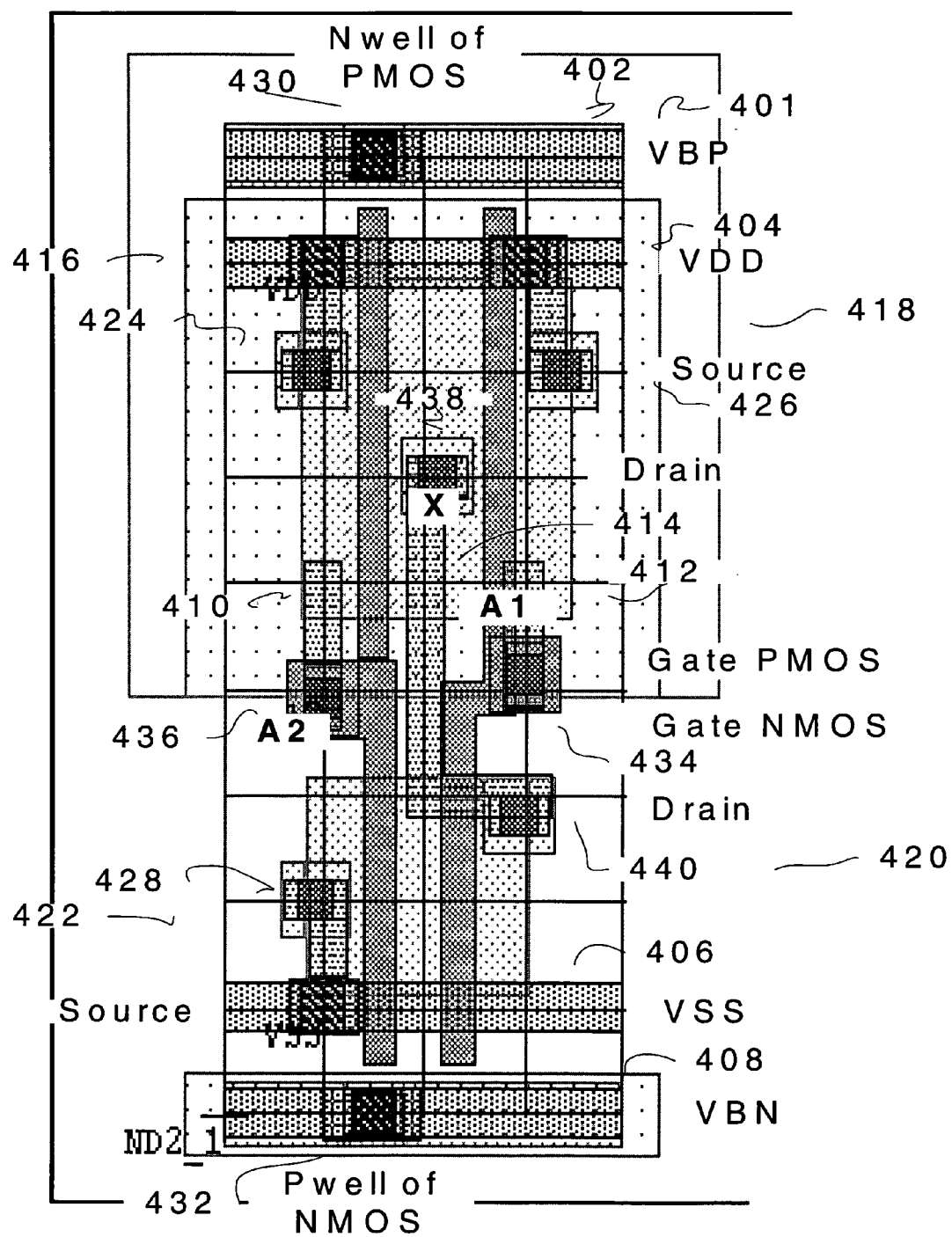
FIG. 4b illustrates a block diagram of an embodiment of transistors in a macro cell connecting to four or more power supply traces.

FIG. 4b illustrates a block diagram of an embodiment of transistors in a macro cell connecting to four or more power supply traces. An integrated circuit may be organized in rows and columns of macro cells with multiple layers of metal such as a first, a second, a third, and a fourth metal layers residing above the macro cells. Each layer of metal is separated from the other by an insulating layer. The first metal layer (M1) is nearest the substrate, the second metal layer (M2) is above the first metal layer, and the third metal layer (M3) is above the second metal layer and is the farthest layer from the substrate. If desired, additional metal layers may also be used.

The second metal layer is above the first metal layer and has a plurality of conductive traces carrying power across the rows. The first metal layer has a plurality of conductive traces that may also carrying power across the rows. In this example layout, the power traces 402–408 in the second metal layer M2 carry power along the rows of macro cells and the first metal layer is used for routing signaling and intraconnections 410–414 for transistors in the basic cells and macro cells. The transistors may be, for example, n-type and p-type, Metal-Oxide-Semiconductor Field-Effect-Transistors.

FIG. 2 also illustrates an example schematic diagram of a sub circuit with transistors in a macro cell.

Referring to FIG. 4b, the macro cell may have set of four transistors within the cell, two n-type NMOS transistors 420, 422 and two p-type PMOS transistors 416, 418. A first power trace 404 in the second metal layer M2 may supply a VDD voltage potential via contacts to the source terminals 224, 426 of the PMOS transistors. A second power trace 406 in the second metal layer M2 may supply a VSS voltage potential via contacts to a source terminal 428 of an NMOS transistor. A third power trace 402 in the second metal layer M2 may supply a third voltage potential, such as VBP, via contacts to a Nwell substrate 430 associated with the PMOS transistors to bias the wells of those transistors. The third voltage potential, VBP, of the third power trace 402 may bias the Nwell substrate 430 higher than the VDD voltage potential on the first power trace 404 to reduce power loss due to leakage. The third voltage potential, VBP, of the third power trace 402 may also bias the Nwell substrate 430 to slightly lower than the VDD voltage potential on the first power trace 404 to enhance the performance switching speed of these transistors.

Similarly, a fourth power trace 408 in the second metal layer M2 may supply a fourth voltage potential, such as VBN, via contacts to a Pwell substrate 432 associated with the NMOS transistors to bias the Pwells of those transistors. The fourth voltage potential, VBN, of the fourth power trace 408 may bias the Pwell substrate 432 lower than the VSS voltage potential on the second power trace 406 to reduce power loss due to leakage. The fourth voltage potential, VBN, of the fourth power trace 408 may also bias the Pwell substrate 432 to slightly higher than the VSS voltage potential on the second power trace to enhance the performance switching speed of these transistors.

Thus, the additional power supplies traces, such as the third power trace 402 and the fourth power trace 408, may route a voltage potential to bias the well substrate 430, 432 of a transistor higher than a source voltage potential on that transistor to reduce power loss due to leakage or in another way alter the biasing of that transistor.

The routing technique allows easier signaling and intraconnection routing with all of the power traces routed in metal layers above the first metal layer. The first signal trace 412 on the first metal layer routed parallel to the columns of macro cells may carry a first input signal (A1) to the gate terminal 434 of one of the NMOS transistors as well as the gate terminal 434 of one of the PMOS transistors. The second signal trace 410 on the first metal layer routed parallel to the columns of macro cells may carry a second input signal (A2) to the gate terminal 436 of the second NMOS transistor as well as the gate terminal 436 of the second of the PMOS transistor. The third signal trace 414 on the first metal layer routed parallel to the columns of macro cells may connect to the drain terminals 438, 440 of the PMOS and NMOS transistors. The third signal trace 414 on the first metal layer may carry the output signal (X) out of this configuration of transistors.

Note, the first macro cell 401 is shown only by way of example. The first macro cell 401 may be advantageously replaced with one or more different macro cells now known, or later developed. Also, although stacked via contacts couple power traces 402–408 with individual macro cells, other methods besides stacked via contacts may be used to make the connections.

The power traces 402–408 may be routed horizontal to the orientation of the macro cell 401 and with a specific relationship to the boundaries of that macro cell. The third power trace 402 carrying VBP may be routed over a first edge of a cell boundary of the first macro cell 401 to share the third power trace 402 with an adjacent cell. The second power trace 406 carrying VSS may be routed along an interior of the cell boundary. Likewise, the first power trace 402 carrying VDD may be routed along the interior of the cell boundary. The fourth power trace 408 carrying the VBN voltage potential may be routed at an opposite edge of the cell boundary. Therefore, the fourth power trace 408 may also be shared with another adjacent cell. Thus, the architectural layout of power trace lines at the edges of adjacent rows of macro cells shifted laterally with respect to each other allows sharing of power supply traces.

In this example, the power traces for the VBP/VBN voltage supplies are at the top/bottom edges of the logic cell. The power traces for VDD/VSS are routed over the logic cell. However, VDD/VSS may be routed on the edges and VBN/VBP may be routed on the interior of the macro cell. The routing of the power traces in relation to the cell boundary may be varied to maximize the density of macro cells in the integrated circuit.

The power traces 402–408 may be routed in metal layers that extend across the integrated circuit predominantly in a direction parallel i.e. horizontal to the rows of macro cells. The metal layers above the first metal layer M1, in this example solely M2, may route four or more different voltage supplies to the transistors in that macro cell. The parallel routing technique in combination with the varied edge and interior routing allows the power supply source connections to VDD/VSS to be easily be completed with no additional cell area consumed by the supply wire for this connection.

The power rails routed in the first metal layer may be routed predominantly horizontal with respect to the rows of macro cells. The power rails routed in the second metal layer may also be routed predominantly horizontal with respect to the rows of macro cells. If no power rails are routed in the first metal layer, then the first metal layer may be routed predominantly horizontal with respect to row of macro cells, or predominantly vertical with respect to row of macro cells, or have no predominant direction at all.

In one embodiment, a master latch and a slave latch may implemented in a single macro cell to form a flip-flop circuit. Also, a master latch and a slave latch may implemented in different macro cells to form various latch-based designs. Thus, the master latch and slave latch circuits may be implemented in single and multiple macro cell implementations.

Figure 5:
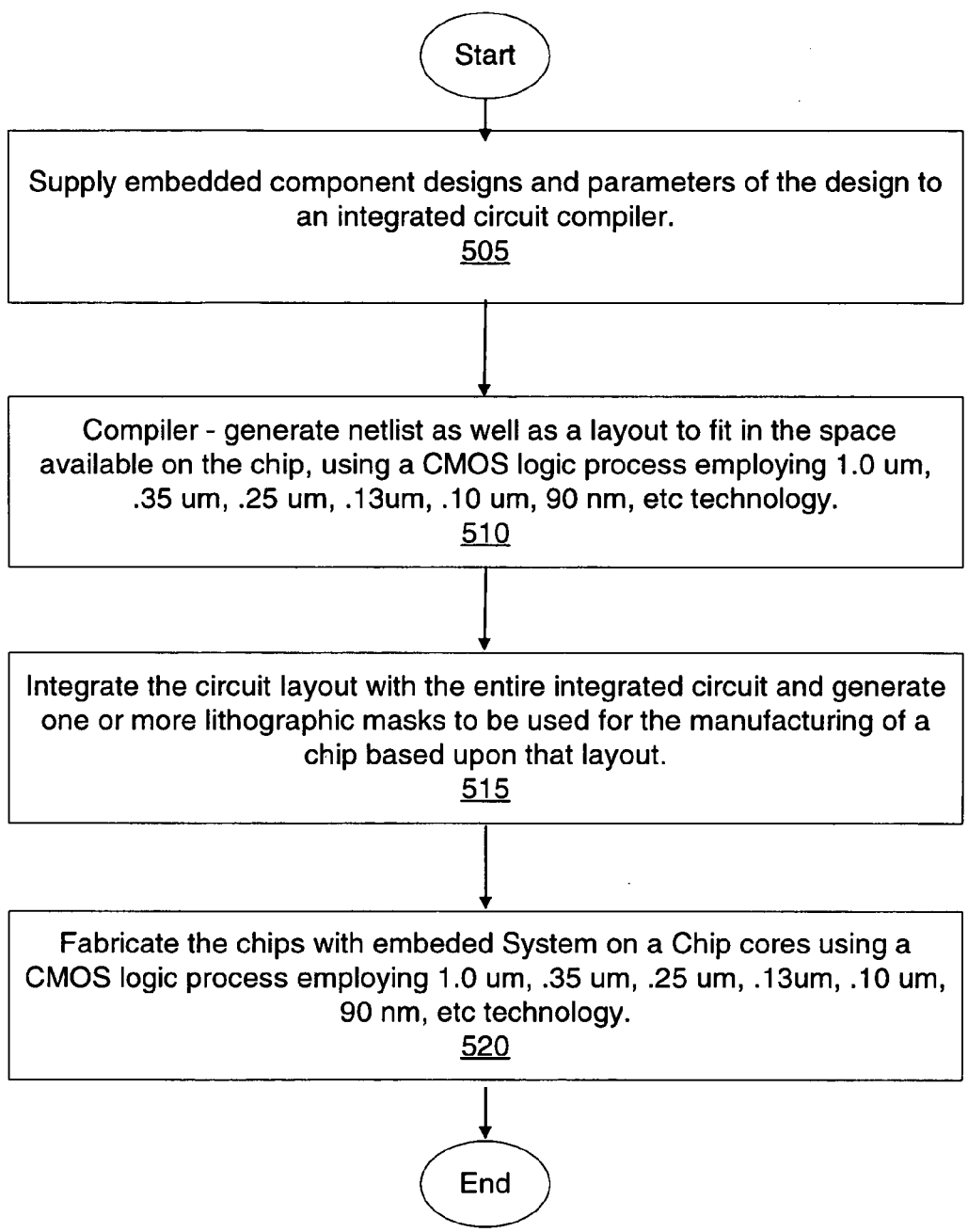
FIG. 5 illustrates an example process of generating an integrated circuit with a volatile latch circuit connecting to multiple power traces with designs of components by means of an embodiment of a compiler.

FIG. 5 illustrates an example process of generating an integrated circuit with a volatile latch circuit connecting to multiple power traces with designs of components by means of an embodiment of a compiler. The compiler may be used for making low power memory and logic platforms, high-density, high-speed and ultra-low-power logic standard cells, metal routing, as well as other applications. The compiler may implement the multiple voltage supply routing scheme.

In block 505, the designs for each processor and memory component for the embedded circuit are supplied to the compiler, as well as other design parameters such as the number of columns and number of rows of the array, the available size on the chip, the number of metal layers, and other parameters. Thus, the designs for a low power memory design may be supplied to the compiler. A compiler may be a software program comprised of multiple algorithms and designs for the purpose of generating a circuit design and a layout in a space available on a target chip. The set of application-specific algorithms and interfaces of the compiler may be used by system IC integrators to rapidly create hundreds of silicon-proven System On a Chip cores. The compiler receives the component designs and utilizes those component designs in conjunction with circuit designs to optimize a circuit design and layout in the space available on a target chip.

In block 510, the compiler generates a netlist and a layout targeted to fit in the space available on a target chip. The compiler stores the data representing the embedded circuit typically on a machine-readable medium. The compiler selects the component building blocks so that they are sized appropriate for the targeted fabrication technology. The compiler then provides the circuit layout to be used to generate one or more lithographic masks to be used in the fabrication of that embedded circuit such as a memory. The compiler also provides a netlist for verification of the embedded circuit.

In block 515, the circuit layout generated is integrated with the rest of the layout for the chip and a machine generates the lithographic masks that contain the information necessary for the fabrication of a functional device. The machine generates one or more lithographic masks to be used to transfer that circuit design onto the chip.

In block 520, a fabrication facility fabricates the chips with the embedded circuits using the lithographic masks generated from the compiler's circuit design and layout. Fabrication facilities may use a standard CMOS logic process having minimum line widths such as 1.0 um, 0.50 um, 0.35 um, 0.25 um, 0.18 um, 0.13 um, 0.10 um, 90 nm, or less, to fabricate the chips. The size of the CMOS logic process employed typically defines the smallest minimum lithographic dimension that can be fabricated on the chip using the lithographic masks, which in turn determines minimum component size. In an embodiment, light is shown through these lithographic masks onto the chip to transfer the circuit design and layout for the embedded circuit onto the chip itself. In an embodiment, the low power memory design compiler is designed for embedded applications in a standard CMOS logic process.

In block 525, the chip may be programmed in the back end of the fabrication process using a layer physically higher than the diffusion layer. The Compiler may generate instances that may be programmed by a ROM programming tool. The Compiler uses routing and cell architecture that allows designers to create custom designs with just a few metal layers and via masks. The via layer and/or metal layer programmed cells may be completed in the back-end of the manufacturing process. If the programming of a ROM memory isn't made until later or a revision is needed, then the designer merely has to redesign the block, a few metal layers and via masks, thereby preserving all of the other masks.

In one embodiment, the software used to facilitate the compiler can be embodied onto a machine-readable medium. A machine-readable medium includes any mechanism that provides (e.g., stores and/or transmits) information in a form readable by a machine (e.g., a computer). For example, a machine-readable medium includes read only memory (ROM); random access memory (RAM); magnetic disk storage media; optical storage media; flash memory devices; DVD's, electrical, optical, acoustical or other form of propagated signals (e.g., carrier waves, infrared signals, digital signals, EPROMs, EEPROMs, FLASH, magnetic or optical cards, or any type of media suitable for storing electronic instructions. Slower mediums could be cached to a faster, more practical, medium.

In an embodiment, an example compiler may comprise the following. A graphic user interface, a common set of processing elements, and a library of files containing design elements such as circuits, control logic, and cell arrays that define the complier. In an embodiment, object code in a set of executable software programs.

In an embodiment, a designer chooses the specifics of a memory configuration to produce a set of files defining the requested memory instances. A memory instance may include front end views and back end files. The front end views support documentation, simulation, debugging, and testing. The back end files, such as a layout, physical LEF, etc are for layout and fabrication.

The complier outputs may include Behavioral Models and Test Benches (Verilog, VHDL), •Timing Models (TLF, .Lib and STAMP), Test Models (MemBIST, FastScan), Structural Netlists (EDIF, Spice), Power Models (WattWatcher, ALF), Floorplanning and Place&Route Models, Physical LEF, FRAM, Layout (GDS), Datasheets (including power, timing, and area specifications, as well as other outputs. When programming occurs or if a revision is needed, the designer merely has to redesign the block, a few metal layers and via masks.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

Although there may be some short departures from the direction of traces on each of the metal layers, the general trend is in the directions described. Departures from the general layout scheme as described may be made for solving ad hoc routing problems.

While some specific embodiments of the invention have been shown the invention is not to be limited to these embodiments. The invention is to be understood as not limited by the specific embodiments described herein, but only by scope of the appended claims.

We claim:

1. A machine readable storage medium that stores data representing an apparatus, which when manipulated by a machine creates the representation of the apparatus, comprising:
    a volatile latch circuit having a master latch sub circuit coupled to a slave latch sub circuit, wherein the slave latch sub circuit maintains a logic state stored by the volatile latch circuit, and the slave sub circuit connects to a first power trace that continuously provides a first voltage potential to the slave latch sub circuit even during a sleep mode, the master latch sub circuit connects to a second power trace that provides a second voltage potential to the master latch sub circuit that is switchably turned off during the sleep mode.

2. The machine-readable medium of claim 1, wherein the machine-readable medium comprises a memory compiler to provide a layout utilized to generate one or more lithographic masks used in fabrication of the volatile latch circuit.

3. The machine readable storage medium of claim 1 that stores additional data representing the apparatus, which when manipulated by the machine creates the representation of the apparatus, further comprising:
    a third power trace to provide a VSS potential to the master latch sub circuit and the slave latch sub circuit.

4. The machine readable storage medium of claim 1 that stores additional data representing the apparatus, which when manipulated by the machine creates the representation of the apparatus, further comprising:
    a buffer circuit connected in between the master latch sub circuit and the slave latch sub circuit to isolate the slave latch sub circuit from the master latch sub circuit.

5. The machine readable storage medium of claim 1 that stores additional data representing the apparatus, which when manipulated by the machine creates the representation of the apparatus, further comprising:
    an output driver coupled to the slave latch sub circuit, wherein the output driver and the master latch sub circuit remain de-energized during the sleep mode.

6. The machine readable storage medium of claim 1 that stores additional data representing the apparatus, wherein the volatile latch circuit is a scan flip flop embedded on a System on a Chip.

7. A machine readable storage medium that stores data representing an apparatus, which when manipulated by a machine creates the representation of the apparatus, comprising:
    an integrated circuit containing
        a volatile latch circuit having a master latch sub circuit and a slave latch sub circuit to store and maintain a logic state, wherein the volatile latch circuit is configured to operate in two or more modes of operation including a sleep mode, wherein the volatile latch circuit having a plurality of transistors is contained in a first macro cell, wherein a first power trace to supply a VDD voltage potential, a second power trace to supply a second voltage potential, and a third power trace to supply a third voltage potential, wherein the power traces connect to the volatile latch circuit, the first power trace connects to a source terminal of a first set of one or more transistors in the first macro cell, and the third power trace connects to a source terminal of a second set of one or more transistors in the macro cell to preserve the logic state of the volatile latch circuit during the sleep mode.

8. The machine-readable medium of claim 7, wherein the machine-readable medium comprises a memory compiler to provide a layout utilized to generate one or more lithographic masks used in fabrication of the volatile latch circuit.

9. The machine readable storage medium of claim 7 that stores additional data representing the apparatus, wherein the second power trace to supply a VSS voltage potential.

10. The machine readable storage medium of claim 7 that stores additional data representing the apparatus, wherein the third power trace to connect to and bias a well substrate of a first transistor in the first set of transistors to operate the volatile latch circuit in three or more power modes as well as three or more performance modes.

11. The machine readable storage medium of claim 7 that stores additional data representing the apparatus, wherein the volatile latch circuit is a non-scan flip flop embedded on an Application Specific Integrated Circuit.

12. A machine readable storage medium that stores data representing an apparatus, which when manipulated by a machine creates the representation of the apparatus, comprising:
    an integrated circuit containing
        a volatile latch circuit to store and maintain a logic value, wherein the volatile latch circuit is configured to operate in two or more modes of operation, wherein a first power trace to supply a VSS voltage potential to a source terminal of a first transistor, a second power trace to supply a VDD voltage potential to a source terminal of a second transistor, and a third power trace to supply a third voltage potential to a well substrate of the second transistor to operate the volatile latch circuit in three or more power consumption modes as well as three or more performance modes.

13. The machine-readable medium of claim 12, wherein the machine-readable medium comprises a memory compiler to provide a layout utilized to generate one or more lithographic masks used in fabrication of the volatile latch circuit.

14. The machine readable storage medium of claim 12 that stores additional data representing the apparatus, which when manipulated by the machine creates the representation of the apparatus, further comprising:

a fourth power trace to supply a fourth voltage potential to a Pwell substrate of a first transistor in a second set of transistors.

15. The machine readable storage medium of claim 14 that stores additional data representing the apparatus, wherein the fourth voltage potential to bias the Pwell substrate lower than the VSS voltage potential on the first power trace to reduce power loss due to leakage.

16. The machine readable storage medium of claim 14 that stores additional data representing the apparatus, wherein the integrated circuit comprises an Intellectual Property core on a System On a Chip.

17. The machine readable storage medium of claim 14 that stores additional data representing the apparatus, wherein the first power trace, the second power trace, the third power trace, and the fourth power trace are routed predominantly in a direction parallel to a row of cells that each contains an implementation of the volatile latch circuit.

18. The machine readable storage medium of claim 12 that stores additional data representing the apparatus, wherein the third power trace to connect to the well substrate associated with each of the first set of one or more transistors to bias the well of that transistor.

19. The machine readable storage medium of claim 12 that stores additional data representing the apparatus, wherein the well substrate comprises an Nwell substrate and the third voltage potential to bias the Nwell substrate higher than the VDD voltage potential on the second power trace.

20. The machine readable storage medium of claim 12 that stores additional data representing the apparatus, wherein the well substrate comprises an Nwell substrate and the third voltage potential to bias the Nwell substrate to be approximately the same as a voltage potential of a source voltage.

21. The machine readable storage medium of claim 12 that stores additional data representing the apparatus, wherein the VDD voltage potential on the second power trace to change from a first voltage level greater than zero to a second voltage level greater than zero to change both the power consumption mode and the performance mode of the volatile latch circuit.

22. The machine readable storage medium of claim 12 that stores additional data representing the apparatus, which when manipulated by the machine creates the representation of the apparatus, further comprising:
  a buffer circuit coupled to the slave latch sub circuit to isolate the slave latch sub circuit when neighboring sub circuits are powered down.

23. The machine readable storage medium of claim 12 that stores additional data representing the apparatus, wherein a second metal layer of the integrated circuit is routed parallel with respect to a cell layout of the volatile latch circuit.

24. A method, comprising:
  routing a first power trace to carry a first voltage potential along a row of macro cells;
  routing a second power trace to carry a second voltage potential along the row of macro cells;
  routing a third power trace to carry a third voltage potential along the row of macro cells;
  routing the row of macro cells on a chip in the same direction as the routed power traces;
  connecting a first macro cell to the first power trace;
  connecting a second macro cell to the second power trace but not the first power trace, wherein the second macro cell is adjacent to the first macro cell and in the same set of rows as the first macro cell; and
  controlling whether power is applied to the first macro cell by changing the first voltage potential from the first power trace.

25. The method of claim 24, wherein changing the first voltage potential from the first power trace controls a performance level of the first macro cell.

26. A machine readable medium that stores data to implement the method of claim 24.

27. The machine-readable medium of claim 26, wherein the machine-readable medium comprises a memory compiler to provide a layout utilized to generate one or more lithographic masks used in fabrication of a volatile latch circuit.

* * * * *